United States Patent [19]
Nakata

[11] Patent Number: 5,838,532
[45] Date of Patent: Nov. 17, 1998

[54] CHIP TYPE ALUMINUM ELECTROLYTIC CAPACITOR

[75] Inventor: Takumi Nakata, Uji, Japan

[73] Assignee: Matsushita Electrical Industrial Co., Ltd., Osaka-fu, Japan

[21] Appl. No.: 908,194

[22] Filed: Aug. 7, 1997

Related U.S. Application Data

[63] Continuation of Ser. No. 515,462, Aug. 15, 1995, abandoned.

[30] Foreign Application Priority Data

Jan. 31, 1995 [JP] Japan .................................... 7-013931

[51] Int. Cl.[6] ...................................................... H01G 9/02
[52] U.S. Cl. .......................... 361/505; 361/504; 361/517; 361/518; 361/535; 361/536; 361/272; 361/274.1
[58] Field of Search ..................... 361/272–273, 361/274.1, 275.1, 275.2, 503–505, 517–520, 535–538; 29/25.03

[56] References Cited

U.S. PATENT DOCUMENTS

| | | |
|---|---|---|
| 4,245,278 | 1/1981 | Finkelstein et al. . |
| 4,591,952 | 5/1986 | Iwamoto et al. . |
| 4,715,976 | 12/1987 | Mori et al. ............................... 252/62.2 |
| 5,177,673 | 1/1993 | Nagara et al. ........................... 361/527 |

FOREIGN PATENT DOCUMENTS

| | | |
|---|---|---|
| 444 895 A2 | 9/1991 | European Pat. Off. . |
| 92-320317 | 4/1991 | Japan . |

OTHER PUBLICATIONS

Patent Abstracts of Japan, vol. 015, No. 397 (E–1120), 8 Oct. 1991 & JP 03161918A (Canon Inc.), 11 Jul. 1991.

Patent Abstracts of Japan, vol. 018, No. 419 (E–1589), 5 Aug. 1994 & JP 06 132165A (Toho Chem Ind Co Ltd), 13 May 1994.

*Primary Examiner*—Bot L. Ledynh
*Attorney, Agent, or Firm*—St. Onge Steward Johnston & Reens LLC

[57] ABSTRACT

A chip type aluminum electrolytic capacitor (1) has a capacitor element (2) impregnated with an electrolytic solution, a cylindrical case (3) for containing the capacitor element (2), a sealing member (4) for sealing the cylindrical case (3), and an insulating board (5) having a mounting surface (5c) to be fixed to an electronic circuit board; and vapor pressure of the electrolytic solution is regulated to a predetermined value to prevent deformations of the cylindrical case (3) and the sealing member (4).

4 Claims, 1 Drawing Sheet

CHIP TYPE ALUMINUM ELECTROLYTIC CAPACITOR

This is a continuation of application Ser. No. 08/515,462 filed on Aug. 15, 1995 now abandoned.

FIELD OF THE INVENTION AND RELATED ART STATEMENT

1. FIELD OF THE INVENTION

This invention relates to a chip type aluminum electrolytic capacitor which is to be used in various electronic apparatuses.

2. DESCRIPTION OF THE PRIOR ART

In recent years, according to needs of small size, thin size and multifunction type for an electronic apparatus, an electronic circuit board is required to mount an increasingly large number of electronic devices such as a chip type aluminum electrolytic capacitor on a fixed region of the electronic circuit board.

Therefore, the electronic device is being required to attain small size and small height. Furthermore, the electronic device is also required to be mounted on the electronic circuit board by a surface mounting method.

A conventional chip type aluminum electrolytic capacitor is disclosed in the Japanese published unexamined patent application (TOKKAI) No. Sho 59-211214. In this chip type aluminum electrolytic capacitor, a capacitor element impregnated with an electrolytic solution is contained in a cylindrical case having an opening. The capacitor element has a pair of lead members connected to an anode foil and a cathode foil, respectively. The pair of the lead members are protruded from the opening in a direction parallel with the axis of the cylindrical case through the below-mentioned sealing member. Furthermore, top end parts of the lead members pass through a pair of holes of the below-mentioned rectangle-shaped insulating board. And then the end tip parts of the lead members are bent at perpendicular directions to the axis so as to be contained in a pair of recesses of the rectangle-shaped insulating board.

The cylindrical case is made of metal such as aluminum, and a diameter of the cylindrical case is between 3 mm and 10 mm. The opening is formed at one end of the cylindrical case, and the other end of the cylindrical case is closed.

In order to prevent evaporation and leaking out of the electrolytic solution, the sealing member is disposed at the opening of the cylindrical case after the capacitor element is contained in the cylindrical case. The sealing member is made of elastic material such as rubber or butadiene rubber, and a peripheral part of the sealing member is held to the inner surface of the cylindrical case. Thereby, the capacitor element is held in the cylindrical case at a predetermined position.

A rectangle-shaped insulating board is made of a resin such as polyphenylene sulfide, having a heat resisting property, and put on the opening so as to close the opening. The rectangle-shaped insulating board has a mounting surface to be fixed to the surface of the electronic circuit board such as a printed circuit board. Furthermore, as has been explained in the above, the rectangle-shaped insulating board has the pair of the holes for passing the lead members, and has the pair of the recesses for containing the top end parts of the lead members. When the top end parts of the lead members are contained in the recesses, the rectangle-shaped insulating board is fixed to the cylindrical case.

It is known that the top end parts of the lead members are fixed to an electronic circuit on the electronic circuit board by a reflow soldering when the chip type aluminum electrolytic capacitor is mounted on the electronic circuit board by the surface mounting method.

However, in the conventional chip type aluminum electrolytic capacitor, vapor pressure of the electrolytic solution is not particullarly controlled taking account of temperature applied at the mounting for the electronic circuit board. Furthermore, elements of the electrolytic solution (i.e., an electrolyte and a solvent) are decided not taking account of a volatility. To describe more concretely, the electrolyte is made of ammonium salt, and the solvent is made of ethylene glycol. Moreover, in the conventional chip type aluminum electrolytic capacitor, there is no consideration for a material such as water, having a lower boiling point, content of the electrolytic solution, etc.

There is a problem that the conventional chip type aluminum electrolytic capacitor is mounted in inclined posture on the electronic circuit board.

The reason is as follows:

When the top end parts of the lead members are fixed to the electronic circuit of the electronic circuit board by the reflow soldering, the chip type aluminum electrolytic capacitor is put on an atmosphere of a high temperature which is more than 200° C. As a result, the electrolytic solution is evaporated in the cylindrical case, and the internal pressure in the cylindrical case is increased. Thereby, deformations are made in the sealing member so that the sealing member is expanded toward the outside of the cylindrical case. Accordingly, warps are generated on the mounting surface of the rectangle-shaped insulating board by the deformations. As a result, the mounting surface is inclined against the surface of the electronic circuit board, so that the conventional chip type aluminum electrolytic capacitor is mounted inclined on the electronic circuit board.

The above-mentioned problem is likely to occur specially in the conventional chip type aluminum electrolytic capacitor having a large diameter of the cylindrical case. The reasons are in more detail as follows:

(1) The vapor pressure of the electrolytic solution causes the increase of the internal pressure in the cylindrical case, and is dependent on the temperature applied at the mounting. For example, even though the diameter of the cylindrical case is changed between 3 mm and 10 mm, it is experimentally confirmed that the vapor pressure of the electrolytic solution is not changed for the same temperature.

(2) Thickness of each cylindrical case and each sealing member is used for the cylindrical case of diameters ranging between 3 mm and 10 mm with substantially the same thickness, respectively. Therefore, strength of each cylindrical case and each sealing member is almost the same for the internal pressure in the cylindrical case.

(3) However, since the peripheral part of the sealing member is held to the inner surface of the cylindrical case, the central part of the sealing member is most deformed to expand outward of the cylindrical case by the internal pressure in the cylindrical case in the case that the thickness of the sealing member and the strength of the sealing member are the same, respectively. This deformation of the central part becomes larger in proportion to the increase of the diameter of the cylindrical case.

(4) In the conventional chip type aluminum electrolytic capacitor, the vapor pressure of the electrolytic solution is not regulated in accordance with the increase of the diameter of the cylindrical case. Therefore, when the internal pressure in the cylindrical case is increased at the reflow soldering, the deformation of the central part of the sealing member is gradually become large in proportion to the increase of the diameter of the cylindrical case, and the deformations of the sealing member exert on the rectangle-shaped insulating board. Thereby, warps are generated on the mounting surface of the rectangle-shaped insulating board by the deformations. As the diameter of the cylindrical case becomes larger, the mounting surface is inclined against the surface of the electronic circuit board.

As has been explained in the above, it is afraid that the conventional chip type aluminum electrolytic capacitor is mounted in inclined posture on the electronic circuit board. In the case that thus inclinations occur to the chip type aluminum electrolytic capacitor, there is a problem that the chip type aluminum electrolytic capacitor is not securely connected to the electronic circuit.

OBJECT AND SUMMARY OF THE INVENTION

The object of the present invention is to provide a chip type aluminum electrolytic capacitor that can solve the aforementioned problems.

In order to achieve the above-mentioned object, a chip type aluminum electrolytic capacitor in accordance with the present invention comprises:

- a capacitor element having a pair of lead members, and the capacitor element is impregnated with an electrolytic solution,
- a cylindrical case for containing the capacitor element, and the cylindrical case having an opening,
- a sealing member for sealing the opening,
- an insulating board is put on the opening, the insulating board having a mounting surface to be fixed to an electronic circuit board, and the mounting surface containing the lead members thereon, and
- vapor pressure of the electrolytic solution is regulated to a predetermined value to prevent deformations of the cylindrical case and the sealing member when the mounting surface is mounted on the electronic circuit board.

According to the chip type aluminum electrolytic capacitor of the present invention, vapor pressure of the electrolytic solution is regulated to the predetermined value so as to prevent deformations of the cylindrical case and the sealing member when the mounting surface is mounted on the electronic circuit board. Therefore, even if the chip type aluminum electrolytic capacitor is exposed to a high temperature and the internal pressure in the cylindrical case is increased by the vapor pressure of the electrolytic solution at fixing of the mounting surface on the electronic circuit board, it is possible to prevent deformations of the cylindrical case and the sealing member. Thereby, it is possible to prevent generation of warps on the mounting surface. As a result, the chip type aluminum electrolytic capacitor can be mounted on the electronic circuit board without inclining thereto.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Hereafter, a preferred embodiment of the present invention are described with reference to the accompanying drawings.

GENERAL EMBODIMENT

Figure 1A:
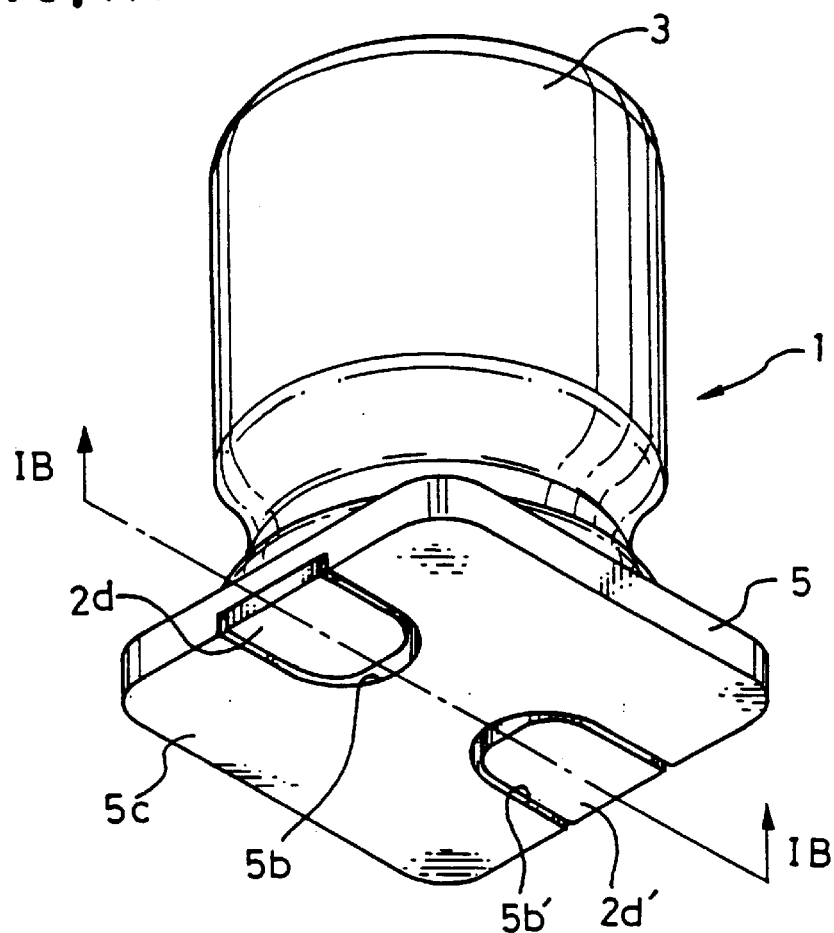
FIG. 1A is a perspective view showing a chip type aluminum electrolytic capacitor of the present invention.
Figure 1B:
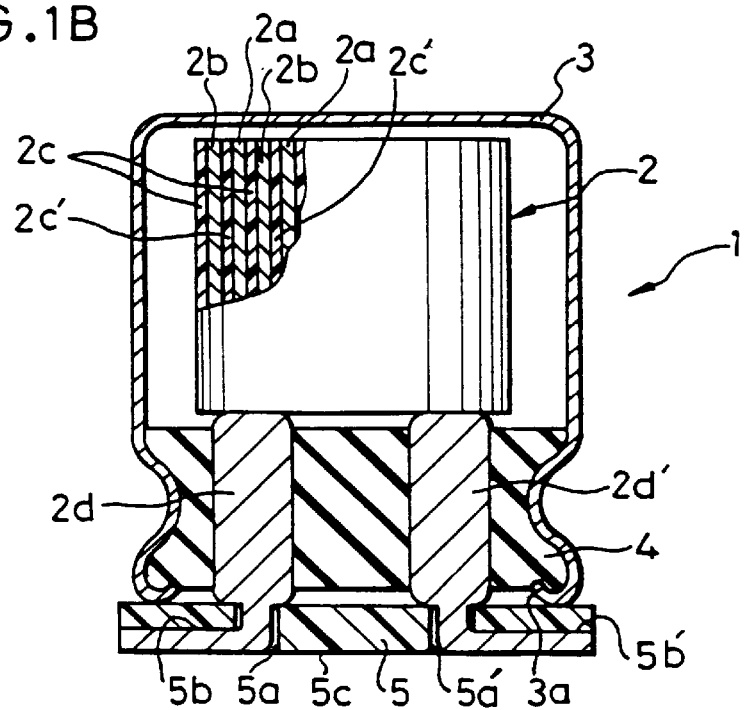
FIG. 1B is a cross sectional view, which is taken on line IB—IB of FIG. 1A, showing the chip type aluminum electrolytic capacitor of the present invention.

FIG.1A is a perspective view showing a chip type aluminum electrolytic capacitor of the present invention. FIG. 1B is a cross sectional view, which is taken on line IB—IB of FIG. 1A, showing the chip type aluminum electrolytic capacitor of the present invention.

In FIGS. 1A and 1B, a chip type aluminum electrolytic capacitor 1 comprises a capacitor element 2 configured by cylindrically winding an aluminum anode foil $2a$, an aluminum cathode foil $2b$ and intermediating separators $2c$, $2c'$ of paper impregnated with an electrolytic solution. The anode foil $2a$ and the cathode foil $2b$ convolutely wound so as to face each other through the separators $2c$, $2c'$ provided between the anode foil $2a$ and the cathode foil $2b$. A pair of lead members $2d$, $2d'$ connected to the anode foil $2a$ and the cathode foil $2b$, respectively. A substantially cylindrical case 3 encapsulates the capacitor element 2. A sealing member 4 is disposed in the cylindrical case 3 between the capacitor element 2 and an opening $3a$ of the cylindrical case 3. A rectangle-shaped insulating board 5 is mounted on the opening $3a$ of the cylindrical case 3. The lead members $2d$, $2d'$ are pulled out of the cylindrical case 3 via the sealing member 4 and a pair of holes $5a$, $5a'$ of the rectangle-shaped insulating board 5, respectively. Furthermore, the top end parts of the lead members $2d$, $2d'$ are bent at perpendicular directions to the axis of the cylindrical case 3 so as to be contained in a pair of recesses $5b$, $5b'$ of the rectangle-shaped insulating board 5, respectively.

The cylindrical case 3 is made of metal such as aluminum, and a diameter of the cylindrical case 3 is between 3 mm and 10 mm on a commercial basis. The opening $3a$ is formed at one end of the cylindrical case 3, and the other end of the cylindrical case 3 is closed.

The sealing member 4 is made of elastic material such as rubber or butadiene rubber, and disposed between the capacitor element 2 and the opening $3a$ for preventing evaporation and leaking out of the electrolytic solution. A peripheral part of the sealing member 4 is held to the inner surface of the cylindrical case 3 by making a dent in the outer surface of the cylindrical case 3. Thereby, the capacitor element 2 is held in the cylindrical case 3 at a predetermined position.

The rectangle-shaped insulating board 5 is made of a resin such as polyphenylene sulfide, having a heat resisting property, and put on the opening $3a$ so as to close the opening $3a$. Thereby, the rectangle-shaped insulating board 5 electrically insulates the cylindrical case 3 from an external electronic circuit board (not shown). As has been elucidated in the above, the rectangle-shaped insulating board 5 has the pair of the holes $5a$, $5a'$ for passing the lead members $2d$, $2d'$ and the pair of the recesses $5b$, $5b'$ for containing the top end parts of the lead members $2d$, $2d'$. Furthermore, the rectangle-shaped insulating board 5 has a mounting surface $5c$ to be fixed to a surface of an electronic circuit board such as a printed circuit board. When the top end parts of the lead members $2d$, $2d'$ are bent and contained in the recesses $5b$, 5b', the rectangle-shaped insulating board 5 is fixed to the cylindrical case 3.

In the case that the chip type aluminum electrolytic capacitor 1 is mounted on the electronic circuit board by a surface mounting method, the top end parts of the lead members 2d, 2d' are fixed to an electronic circuit on the electronic circuit board by a reflow soldering or the like. In this reflow soldering, it is known that a cream solder is painted on the electronic circuit, and the lead members 2d, 2d' are put on and temporarily fixed to the cream solder. Thereafter, in order to melt the cream solder, the electronic circuit board having the chip type aluminum electrolytic capacitor 1 is put in a soldering bath heated to an atmosphere of a high temperature (hereinafter referred to as a "mounting temperature") of 200° C. or above by an irradiation of an infrared rays or a hot-air blowing. As a result, the chip type aluminum electrolytic capacitor 1 is fixed to the electronic circuit board by the cream solder. Thus, since the chip type aluminum electrolytic capacitor 1 is put on the high temperature having more than 200° C., the electrolytic solution is evaporated in the cylindrical case 3, and the internal pressure in the cylindrical case 3 is increased by vapor pressure of the electrolytic solution.

However, in the present invention, the vapor pressure in the electrolytic solution at the mounting temperature is regulated to a predetermined value to prevent deformations of the cylindrical case 3 and the sealing member 4. That is, the electrolytic solution is composed of a non-volatile material or a material having a higher boiling point. In the concrete, an electrolyte is made of amine salt or quaternary ammonium salt, and a solvent is made of γ-butyrolactone.

Furthermore, the electrolytic solution has been regulated so as to have such a low boiling point content not to make a high vapor pressure. Representative of the material having the low boiling point generally is water, which has the boiling point is of 100° C. (at 1 atmospheric pressure). Generally, water is not used for preparing the electrolytic solution of the chip type aluminum electrolytic capacitor. However, water is contained in the electrolytic solution by the following reasons:

(1) Water exists in the elements of the electrolytic solution by means of chemical bond. For example, the electrolyte includes water in it's chemical constitution.

(2) Water is generated in the electrolytic solution as a result of reaction between the electrolyte and the solvent during preparation of the electrolytic solution.

(3) Water exists in the electrolytic solution as a result of absorption after the electrolytic solution is prepared.

Furthermore, in the inside of the cylindrical case 3, water exists in capacitor element 2 as a result of physically adsorption. That is, water is adversely adsorbed to the separators 2c, 2c'.

On the contrary to such undesirable water, in this embodiment, water content contained inside the cylindrical case 3 is regulated to a predetermined quantity (hereinafter referred to as a "regulated quantity of water") as follows:

(1) With regard to water resulted from the above-mentioned chemical bond and reaction, the water is regulated by adjusting quantities of the electrolyte and solvent.

(2) With regard to water resulted from the above-mentioned adsorption and absorption, the water is regulated by performing desiccation process.

Test results of the chip type aluminum electrolytic capacitor manufactured by the above-mentioned process are shown in Table 1. This test was performed in six working examples wherein materials of the elements of the electrolytic solution and the regulated quantity of water are varied as shown in Table 1. The working example No.6* is a comparison working example in accordance with the prior art. The regulated quantity of water is measured by a moisture meter, and is equal to the sum of water contents of the electrolytic solution and the capacitor element 2. As shown in Table 1, the regulated quantity of water is shown by a proportion to quantity of the electrolytic solution.

In this test, the test results are obtained by methods as shown in the following steps I and II:

(I) In the respective six working examples, 1000 pieces of the chip type aluminum electrolytic capacitor were mounted on the electronic circuit board by the reflow soldering. Rated values and size of the chip type aluminum electrolytic capacitor are as follows:

Rated voltage is 50 V.

Rated capacitance is 47 μF.

The diameter of the cylindrical case is 10 mm.

Furthermore, heat conditions in the reflow soldering were as follows:

(1) Preheating condition; temperature is 160° C. (Continuing time is 120 seconds.)

(2) Heating condition; temperature is 200° C. (Continuing time is 30 seconds.)

(3) Peak temperature is 230° C. (Continuing time is within 5 seconds.)

(II) It was inspected whether the chip type aluminum electrolytic capacitor was mounted inclined on the electronic circuit board by generation of warps in the mounting surface. The number of an inclined chip type aluminum electrolytic capacitor was counted.

TABLE 1

| Working example No. | Materials of the elements of the electrolytic solution; the electrolyte the solvent | | Regulated quantity of water (wt %) | Test results (piece) |
| --- | --- | --- | --- | --- |
| 1 | quaternary ammonium salt | 20 (wt %) | 2 (wt %) | 0 |
|   | γ-butyrolactone | 80 (wt %) |   | (piece) |
| 2 | amine salt | 22.5 (wt %) | 2 (wt %) | 0 |
|   | γ-butyrolactone | 77.5 (wt %) |   | (piece) |
| 3 | amine salt | 22.5 (wt %) | 5 (wt %) | 0 |
|   | γ-butyrolactone | 77.5 (wt %) |   | (piece) |
| 4 | amine salt | 22.5 (wt %) | 10 (wt %) | 0 |
|   | γ-butyrolactone | 77.5 (wt %) |   | (piece) |
| 5 | amine salt | 22.5 (wt %) | 15 (wt %) | 7 |
|   | γ-butyrolactone | 77.5 (wt %) |   | (pieces) |
| 6* | ammonium salt | 12 (wt %) | 2 (wt %) | 105 |
|   | ethylene glycol | 88 (wt %) |   | (pieces) |

(6* is the comparison example.)

As shown in the working examples No. 1, 2, 3 and 4 of Table 1, it is found that the chip type aluminum electrolytic capacitor 1 is mounted on the electronic circuit board without inclining thereto. For the reason as has been explained in the above, the vapor pressure of the electrolytic solution is regulated to the predetermined value to prevent deformations of the cylindrical case 3 and the sealing member 4. Therefore, when the internal pressure in the cylindrical case 3 is increased by the evaporation pressure of the electrolytic solution, it is possible to prevent deformations of the cylindrical case 3 and the sealing member 4; and thereby, it is possible to prevent generation of warps on the mounting surface 5c.

When the regulated quantity of water is more than 10 wt % of the quantity of the electrolytic solution, e.g. as shown in the working example No. 5, it is afraid that the chip type aluminum electrolytic capacitor 1 is mounted inclined on the electronic circuit board. This is because the internal pressure in the cylindrical case 3 exceeds a value to generate deformations of the cylindrical case 3 and the sealing member 4 by evaporation of the water; and thereby, the warps generates in the mounting surface 5c. Accordingly, it is preferable that the regulated quantity of water must be under 10 wt % by weight of the quantity of the electrolytic solution, and is further preferably under 5 wt % by weight thereof. In the above-mentioned test, according to the inventor's analysis from degree of the warps, when the chip type aluminum electrolytic capacitor 1 was mounted inclined on the electronic circuit board, the internal pressure in the cylindrical case 3 was roughly between 30 atmospheric pressure and 60 atmospheric pressure (at temperature between 180° C. and 220° C.).

There is no limitation for weight percentages, which are shown in the working examples No. 1, 2, 3, 4 and of Table 1, between the electrolyte and the solvent. That is, in the case that the electrolytic solution is composed of quaternary ammonium salt and γ-butyrolactone in the working example No. 1 of Table 1, it is preferable to use quaternary ammonium salt in a range between 5 wt % and 50 wt % by weight, and γ-butyrolactone in a range between 95 wt % and 5 wt % by weight depending on prepared weight of quaternary ammonium salt. In the case that electrolytic solution is composed of amine salt and γ-butyrolactone in the working examples No. 2–5 of Table 1, it is preferable to use amine salt in a range between 5 wt % and 50 wt % by weight, and γ-butyrolactone in a range between 95 wt % and 50 wt % by weight depending on prepared weight of amine salt.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A chip type aluminum electrolytic capacitor comprising:

a capacitor element (2) having a pair of lead members (2d, 2d'), and said capacitor element being impregnated with an electrolytic solution composed of a non-volatile material with a higher boiling point than water and wherein water is not an added ingredient in the preparation of the electrolyte solution, a cylindrical case (3) for containing said capacitor element, and said cylindrical case having an opening (3a), a seal member (4) for sealing said opening, an insulating board (5) being put on said opening, said insulating board having a mounting surface (5a) to be fixed to an electronic circuit board, and said mounting surface containing said lead members thereon, and wherein, water in the electrolyte solution and present in the form of a chemical bonding, reaction, adsorption and absorption, inside of said cylindrical case, is regulated in quantity so as to be sufficiently low in percentage by weight of said electrolytic solution that the internal pressure in said cylindrical case is less than a value at which deformations are generated in the cylindrical case and in said seal member from the evaporation of said regulated quantity of water when said mounting surface is mounted on said electronic circuit board and is subjected to a temperature in excess of the evaporation temperature of water.

2. A chip type aluminum electrolytic capacitor in accordance with claim 1, wherein said electrolytic solution includes γ-butyrolactone.

3. A chip type aluminum electrolytic capacitor in accordance with claim 2, wherein said electrolytic solution is composed essentially of amine salt as an electrolyte and said γ-butyrolactone as an solvent, said amine salt is contained in a range between 5 wt % and 50 wt % by weight.

4. A chip type aluminum electrolytic capacitor in accordance with claim 1, wherein said electrolytic solution is composed essentially of amine salt as an electrolyte and said γ-butyrolactone as a solvent, said amine salt is contained in a range between 5% and 50% by weight.

* * * * *

UNITED STATES PATENT AND TRADEMARK OFFICE
CERTIFICATE OF CORRECTION

PATENT NO. : 5,838,532
DATED : November 17, 1998
INVENTOR(S) : Takumi Nakata

It is certified that error appears in the above-indentified patent and that said Letters Patent is hereby corrected as shown below:

Column 8, line 13, "(5a)' should be ---(5c)--

Signed and Sealed this

Twenty-third Day of November, 1999

Attest:

Q. TODD DICKINSON

*Attesting Officer*    *Acting Commissioner of Patents and Trademarks*